(12) United States Patent
Epping

(10) Patent No.: US 11,754,907 B2
(45) Date of Patent: Sep. 12, 2023

(54) PHOTON-PAIR SOURCE FOR QUANTUM APPLICATIONS

(71) Applicant: LioniX International BV, Enschede (NL)

(72) Inventor: Jörn Philipp Epping, Münster (DE)

(73) Assignee: LIONIX INTERNATIONAL BV, Enschede (NL)

( * ) Notice: Subject to any disclaimer, the term of this patent is extended or adjusted under 35 U.S.C. 154(b) by 307 days.

(21) Appl. No.: 17/226,608

(22) Filed: Apr. 9, 2021

(65) Prior Publication Data

US 2021/0328407 A1    Oct. 21, 2021

Related U.S. Application Data

(60) Provisional application No. 63/012,844, filed on Apr. 20, 2020.

(51) Int. Cl.
*G02F 1/35* (2006.01)
*H01S 5/14* (2006.01)
(Continued)

(52) U.S. Cl.
CPC ....... *G02F 1/3536* (2013.01); *G02B 6/12004* (2013.01); *G02B 6/12007* (2013.01);
(Continued)

(58) Field of Classification Search
CPC ............ G02B 6/12004; G02B 6/12007; G02B 6/29343; G02B 2006/12121;
(Continued)

(56) References Cited

U.S. PATENT DOCUMENTS 7,146,087 B2    12/2006  Heideman et al.
7,835,417 B2    11/2010  Heideman et al.
(Continued)

FOREIGN PATENT DOCUMENTS

GB    2522252 A   *   7/2015   ........... G02B 6/1228

OTHER PUBLICATIONS

Authorized Officer: Dregely, Daniel, International Search Report and Written Opinion issued in PCT application No. PCT/IB2021/053025, dated Jun. 4, 2021, 12 pp.
(Continued)

*Primary Examiner* — Daniel Petkovsek
(74) *Attorney, Agent, or Firm* — Kaplan Breyer Schwarz, LLP

(57) ABSTRACT

Aspects of the present disclosure are directed to photon-pair sources based on an external-cavity laser comprising a gain element and a planar-lightwave circuit that includes a surface-waveguide-based mirror and a ring resonator that enables four-wave mixing, where the surface-waveguide mirror and the ring resonator reside within the gain cavity of the laser itself. As a result, photon-pair sources in accordance with the present disclosure can have: (1) a larger free-spectral range for the entire laser cavity to enable generation of a single wavelength to realize single-mode operation without additional stabilization; and (2) low laser noise, thereby enabling detection and use of the generated photon pairs.

15 Claims, 5 Drawing Sheets

(51) Int. Cl.
  *H01S 5/026*   (2006.01)
  *G02F 1/365*   (2006.01)
  *G02B 6/293*   (2006.01)
  *G02B 6/12*    (2006.01)
  *G02F 1/39*    (2006.01)

(52) U.S. Cl.
  CPC ....... *G02B 6/29343* (2013.01); *G02F 1/3526* (2013.01); *G02F 1/365* (2013.01); *H01S 5/026* (2013.01); *H01S 5/142* (2013.01); *G02F 1/39* (2013.01)

(58) Field of Classification Search
  CPC ...... G02F 1/3526; G02F 1/3536; G02F 1/365; G02F 1/39; H01S 5/026; H01S 5/1071; H01S 5/142
  See application file for complete search history.

(56) References Cited

U.S. PATENT DOCUMENTS

| | | | |
|---|---|---|---|
| 8,718,432 B1 | 5/2014 | Heideman et al. | |
| 9,221,074 B2 | 12/2015 | Heideman et al. | |
| 9,268,089 B2 | 2/2016 | Heideman et al. | |
| 9,764,352 B2 | 9/2017 | Heideman et al. | |
| 10,811,848 B2* | 10/2020 | Zilkie | H01S 5/4087 |
| 11,320,587 B2* | 5/2022 | Oldenbeuving | G02B 6/29343 |
| 2016/0049767 A1 | 2/2016 | Morton et al. | |
| 2018/0048110 A1 | 2/2018 | Jestin et al. | |
| 2019/0058306 A1 | 2/2019 | Wen et al. | |

OTHER PUBLICATIONS

Caspani Lucia et al., "Integrated source of multiplexed photon pairs", 2014 Conference on Lasers and Electro-Optics (CLEO)—Laser Science to Photonic Applications, The Optical Society, Jun. 8, 2014, https://www.doi.org/10.1364/CLEO_QELS.2014.FW3A.7, 2 pp.

Pfeifle Joerg et al, "Coherent terabit communications with microresonator Kerr frequency combs", Apr. 13, 2014, https://www.doi.org/10.1038/NPHOTON.2014.57, p. 375-380, vol. 8, No. 5, https://portal.issn.org/resource/ISSN/1749-4885.

Roeloffzen, et al., "Low-Loss Si3N4 TriPlex™ Optical Waveguides: Technology and Applications Overview", IEEE J. Sel. Top. Quantum Electron 24, Jul. 1, 2018, pp. 1-21, vol. 24, No. 4.

Communication issued in European patent application No. 21719732.6, dated Nov. 29, 2022, 3 pp.

* cited by examiner

PHOTON-PAIR SOURCE FOR QUANTUM APPLICATIONS

STATEMENT OF RELATED CASES

This case claims priority of U.S. Provisional Patent Application Ser. No. 62/012,844, filed Apr. 20, 2020, which is incorporated herein by reference.

If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to quantum processing and integrated-optics-based light sources.

BACKGROUND OF THE INVENTION

Sources of correlated photon pairs are sought after for use in quantum applications, such as quantum computing, quantum communications, quantum sensing, quantum imaging, and the like. In order for them to be practical, however, such quantum-processing systems must become more compact than have been demonstrated thus far. Unfortunately, many available photon-pair sources are seen as unsuitable for use in these systems due to the large size they typically require.

As a result, there has been a recent push toward integrated-optics-based systems, which offer the promise an integrated photon-pair source. Examples of such approaches are disclosed, for instance, by Y. Jestin, et al., in US. Patent Publication No. 2018/0048110, which is incorporated herein by reference. These systems incorporate a single non-linear resonant element in the laser cavity of an external-cavity laser and pulses are created by mode-locking the cavity modes of the laser.

While the benefits of integration are well understood, approaches disclosed to date have several potential problems, such as a limited free-spectral range (FSR), and a need to include an optical isolator in the gain cavity, which negatively impacts the utility of such systems since optical isolators are notoriously difficult to integrate into an integrated-optics system.

Furthermore, the need to establish mode-locking with an external laser gives rise to system complexities and operational challenges that are undesirable.

A need therefore exists for an integrated approach to creating a photon pair without some of the costs and disadvantages of the prior art.

SUMMARY OF THE INVENTION

The present disclosure is directed toward photon-pair sources that are based on an external-cavity laser configuration. An advance over the prior art is realized by employing a photonic integrated circuit that includes an external cavity laser having a linear laser cavity that includes a plurality of waveguide resonators that are optically coupled in series, where one of the waveguide resonators is configured to generate photon pairs via four-wave mixing. The laser is included in a photonic integrated circuit that includes a gain element and a planar lightwave circuit, both of which are disposed on the same substrate. The gain element includes a first mirror and the planar lightwave circuit includes a second mirror, which resides within the laser cavity itself.

As a result, embodiments in accordance with the present disclosure are afforded at least three significant advantages over single-ring-resonator-based photon-pair sources of the prior art, including: (1) a laser cavity having a larger free-spectral range, thereby enabling generation of a single wavelength within the gain spectrum of the gain element to realize single-mode operation without additional stabilization, such as locking to an external laser; (2) suppression of laser noise (e.g., amplified spontaneous emission, etc.) to a level low enough to enable detection, and use, of the generated photon pairs; and (3) elimination of an optical isolator with in the gain cavity, by avoiding the use of a ring-shaped laser cavity.

An illustrative embodiment in accordance with the present disclosure is a photonic integrated circuit configured as an external-cavity laser for providing photon pairs, where the external cavity laser is wavelength tunable and has large FSR. The photonic integrated circuit includes a planar-lightwave circuit and a gain element that is optically coupled with the planar-lightwave circuit. The planar-lightwave circuit includes a tunable, Vernier-type, waveguide-resonator-based mirror that is within the laser cavity itself and configured to function as one mirror of the laser cavity, while a high-reflectivity coating formed on one facet of the gain element functions as the other mirror of the laser cavity. Photon pairs are selectively generated via four-wave mixing in a photon-pair-generating closed-loop waveguide within the Vernier-mirror arrangement.

The gain element is an indium phosphide reflective semiconductor optical amplifier that has a first facet comprising the high-reflectivity coating and a second facet comprising an anti-reflection coating configured to facilitate optical coupling with the input port of the planar-lightwave circuit. The gain element is disposed on a mounting region formed on the substrate, where the mounting region is configured to facilitate good optical coupling between the second facet and the input port, as well as to provide electrical connectivity to the gain element. In some embodiments, one or both of the gain element and input port of the planar-lightwave circuit includes a spot-size converter to mitigate mode mismatch at their interface, as well as improve alignment tolerance. In some embodiments, residual reflections at the interface between the gain element and planar-lightwave circuit are mitigated by angling one or both of the waveguides on the gain element and planar-lightwave circuit and/or filling the gap between the gain element and input port with an index-matching material.

The planar-lightwave circuit includes a network of integrated-optics-based surface waveguides formed on a substrate, where the surface waveguides include a pair of silicon nitride waveguides separated by a thin layer of silicon oxide, thereby collectively defining a double-stripe waveguide configuration. The waveguides of the planar-lightwave circuit collectively define an input port that is optically coupled with a pair of output ports via a tunable coupler and the waveguide-resonator-based mirror arrangement. The number and sizes of the closed-loop waveguides of the mirror arrangement are selected to realize a desired FSR, as well as to substantially suppress noise generated in the gain cavity of the external-cavity laser.

In the illustrative embodiment, the mirror arrangement includes five waveguide resonators whose closed-loop elements are ring-shaped (i.e., five "ring resonators"), including a photon-generating ring at which pairs of photons are simultaneously generated. The size of the photon-generating ring is selected such that the output of the source fits within the standard wavelengths used in optical telecommunications (e.g., the ITU grid). Each pair of adjacent rings of the mirror arrangement are optically coupled via a different bus waveguide and the bus waveguides adjacent to the photon-generating ring convey the generated photon pairs to the output ports.

In the illustrative embodiment, the laser cavity also includes a tunable coupler that is configured to split light in the laser cavity into each of the outer bus waveguides of the waveguide-resonator mirror arrangement. Inclusion of the tunable coupler enables control over the optical power within the laser cavity, thereby enabling control over the rate at which photons are generated.

In some embodiments, the planar-lightwave circuit mirror arrangement includes a different number of waveguide resonators. In some embodiments, at least one of the waveguide resonators of the mirror arrangement includes a closed-loop element other than a ring, such as an oval, a racetrack, an irregular shape, and the like. It should be noted that any suitable size (e.g., radius for a ring, or closed-loop length for a different closed-loop element) can be used for any waveguide resonator of the planar-lightwave circuit mirror arrangement.

In some embodiments, pulses are generated by directly driving a gain element rather than modulating the laser, directly tuning a waveguide resonator, or tuning an external laser, thereby mitigating pulse interference during operation. In some embodiments, the laser is not modulated.

In some embodiments, the planar-lightwave circuit includes waveguides comprising one or materials other than silicon nitride and/or silicon oxide.

In some embodiments, the planar-lightwave circuit includes a waveguide having a waveguide configuration other than a double stripe waveguide (e.g., single-stripe waveguides, channel waveguides, ridge waveguides, etc.).

An embodiment in accordance with the present disclosure is a source for providing correlated photon pairs, the source comprising an external cavity laser having a gain cavity, the external cavity laser including: a gain element that is disposed on a substrate, the gain element comprising a first mirror; and a planar lightwave circuit (PLC) disposed on the substrate, the PLC including: (i) a second mirror, wherein the second mirror includes at least one integrated-optics-based surface waveguide; and (ii) first and second output ports for providing the photon pairs; wherein the source is characterized by: the PLC including (iii) a plurality of waveguide resonators that includes a first waveguide resonator that enables four-wave mixing; the second mirror residing within the gain cavity; the gain cavity being isolator-free; and the first and second output ports being optically connected with the first waveguide resonator.

Another embodiment in accordance with the present disclosure is a method for generating correlated photon pairs, the method including: exciting optical energy in a laser cavity of an external cavity laser comprising a gain element and a planar lightwave circuit (PLC), the gain element and the PLC being disposed on a substrate, wherein the laser cavity includes a first mirror and a second mirror, and wherein the gain element comprises the first mirror and the PLC comprises: (i) the second mirror, where the second mirror includes at least one integrated-optics-based surface waveguide; (ii) a first waveguide resonator that enables four-wave mixing; (iii) first and second output ports; and (iv) first and second output ports for providing the photon pairs; generating at least one correlated photon pair in the first waveguide resonator; and conveying the at least one correlated photon pair to at least one of the first and second output ports; wherein the method is further characterized by: providing the external cavity laser so that second mirror is in the laser cavity and the gain cavity is isolator-free; providing the PLC such that it includes a plurality of waveguide resonators that comprises a first waveguide resonator that enables four-wave mixing; and providing the PLC such that the first and second output ports are directly optically coupled with the first waveguide resonator.

DETAILED DESCRIPTION

The following terms are defined for use in this Specification, including the appended claims:

optically coupled is defined as being in the same optical path such that light can propagate between two optical elements. Optically coupled elements can be arranged such that: (1) light propagates directly from one to the other without any intervening elements (e.g., a laser that is butt-coupled to an optical fiber without a lens, mirror, or other medium between them, etc.); (2) light propagates from one to the other via an intermediate element (e.g., a laser and optical fiber configured such that the output signal from the laser propagates through a lens enroute to an input facet of the optical fiber, etc.); or (3) light propagates from one to the other via multiple intermediate elements (a laser and optical fiber configured such that the output signal from the laser propagates through a lens to a turning mirror that redirects the output signal to an input facet of the optical fiber, etc.).

optically connected is defined as being directly optically coupled without any intervening element or elements (e.g., a laser that is butt-coupled to an optical fiber without a lens, mirror, or other medium between them, a bus waveguide that is located in close proximity with a waveguide resonator such that light can evanescently couple directly between them, etc.).

Figure 1:
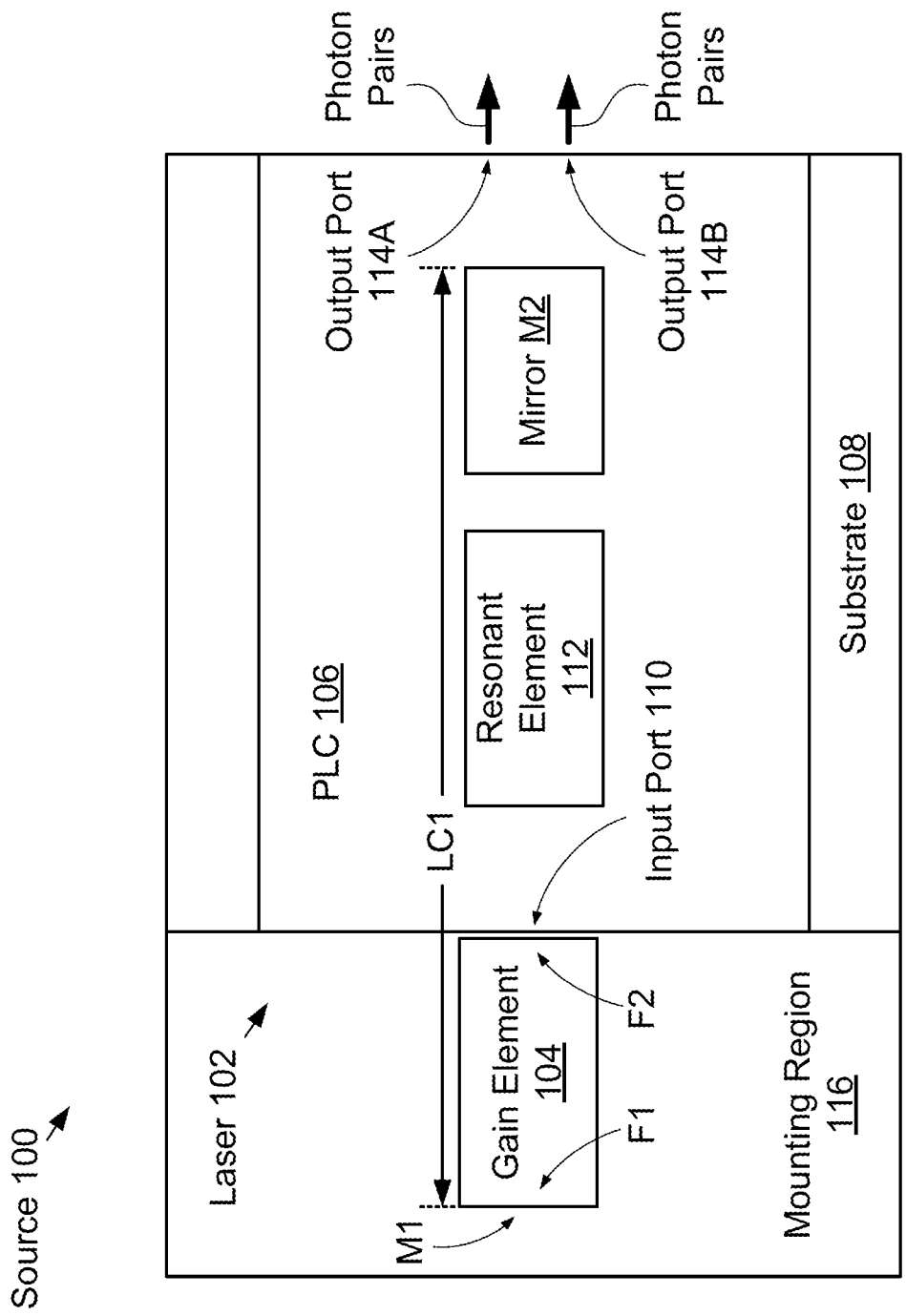
FIG. 1 depicts a schematic drawing of an illustrative embodiment of a photon-pair source in accordance with the present disclosure.

FIG. 1 depicts a schematic drawing of an illustrative embodiment of a photon-pair source in accordance with the present disclosure. Source 100 is a photonic integrated circuit that comprises external cavity laser 102, which includes gain element 104 and planar lightwave circuit 106, which are integrated on substrate 108.

Figure 2:
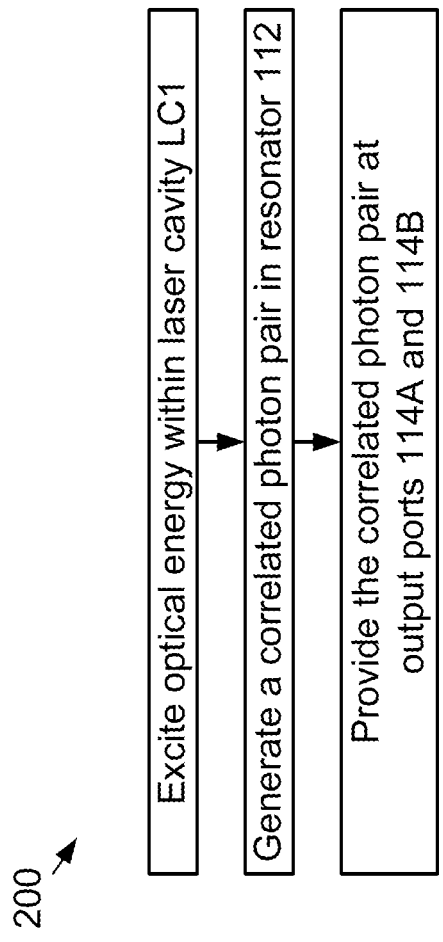
FIG. 2 depicts operations of a method for generating correlated photon pairs in accordance with the illustrative embodiment.

FIG. 2 depicts operations of a method for generating correlated photon pairs in accordance with the illustrative embodiment. Method 200 begins with operation 201, wherein optical energy is excited within the laser cavity of external cavity laser 102 (hereinafter referred to simply as "laser 102").

Gain element 104 is an InP reflective semiconductor optical amplifier (RSOA) having a gain-enabling waveguide that includes first facet F1 and second facet F2. First facet F1 includes a high-reflectivity coating (e.g., metal, Bragg mirror, etc.) such that the facet and coating collectively define mirror M1. Second facet F2 includes an anti-reflection coating suitable for mitigating reflections at the wavelengths of operation of source 100. In some embodiments, gain element 104 comprises a material other than indium phosphide.

Planar lightwave circuit (PLC) 106 is a network of integrated-optics-based surface waveguides that includes input port 110, resonant element 112, output ports 114A and 114B, and mirror M2.

Gain element 104 and PLC 104 are arranged such that facet F2 is optically coupled with input port 110, thereby defining laser cavity LC1, which includes mirrors M1 and M2. It is an aspect of the present disclosure that the elements included in laser cavity LC1 are arranged in series (i.e., laser cavity LC1 is a "linear cavity"). Since laser cavity LC1 is a linear cavity, it does not require the inclusion of an optical isolator, reducing the cost and complexity of source 100.

Gain element 104 is mounted, top-side down, on mounting region 116 of substrate 108. Mounting region 116 also includes contact pads (not shown), which are configured to enable electrical connectivity to electrical contacts formed on the top surface of the gain element.

Mounting region 116 is a region of substrate 108 that has been etched to a depth based on the distance between the top surface of gain element 104 and its gain-enabling waveguide. In some embodiments, a vertical alignment stop is included as part of at least one of gain element 104 and substrate 108 to facilitate vertical alignment of facet F2 and input port 110.

When gain element 104 is mounted, top-side down, on mounting region 116, vertical alignment between input port 110 and facet F2 can be achieved passively, significantly reducing the cost and complexity associated with the hybrid integration of gain element 104 and PLC 106. In some embodiments, one or both of gain element 104 and input port 110 includes a spot-size converter to facilitate good optical coupling between input port 110 and facet F2. In some embodiments, the waveguide on each side is tilted and/or the air gap between gain element 104 and PLC 106 is filled with a material, such as thermally or UV-curable epoxy, to match the effective refractive index of input port 110 (or that of gain element 104) to mitigate residual reflections at the interface between them. In some embodiments, gain element 104 is actively aligned with input port 110.

In some embodiments, gain element 104 includes an integrated modulator for direct modulation.

Figure 3:
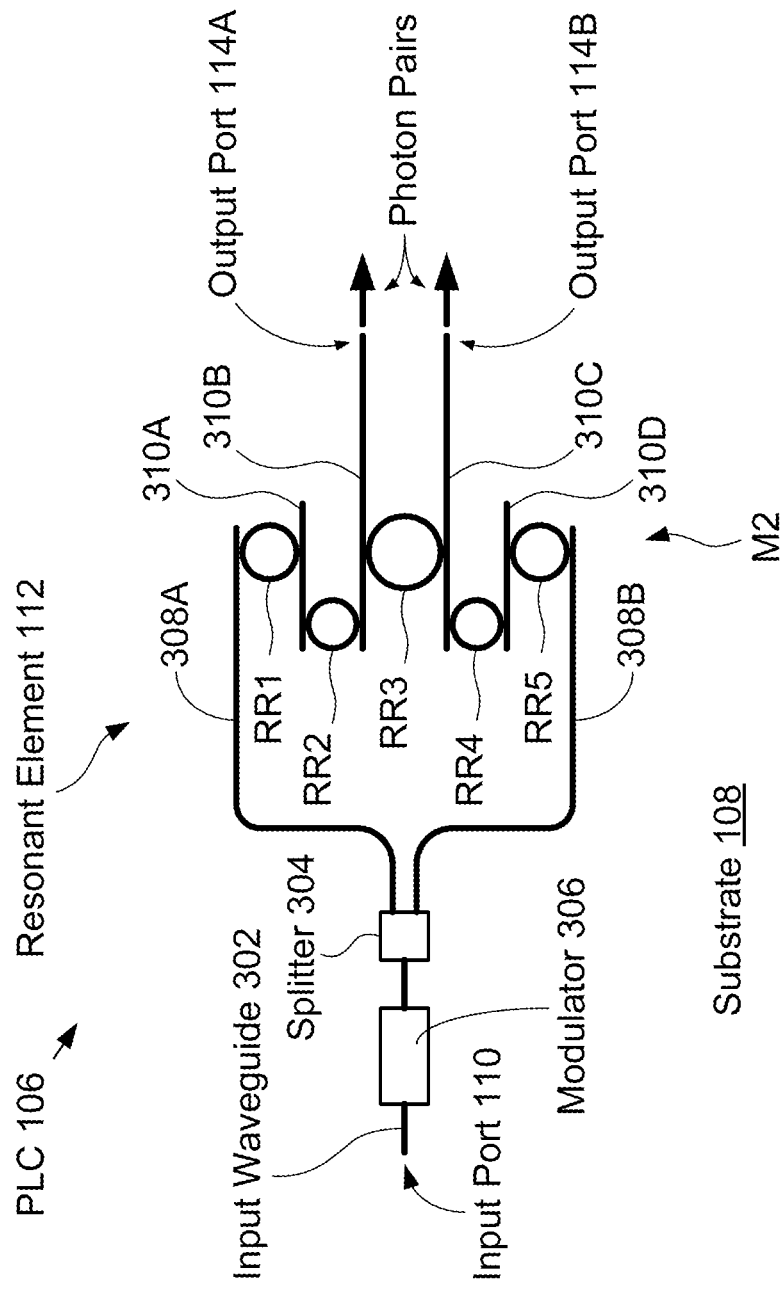
FIG. 3 depicts a schematic drawing of a more detailed view of PLC 106 in accordance with the illustrative embodiment.

FIG. 3 depicts a schematic drawing of a more detailed view of PLC 106 in accordance with the illustrative embodiment. The network of integrated-optics-based surface waveguides of PLC 106 are configured to define input waveguide 302, modulator 304, resonant element 112, and output ports 114A and 114B.

Input waveguide 304 is a silicon-nitride-based, double-stripe waveguide whose end facet defines input port 110.

Figure 4:
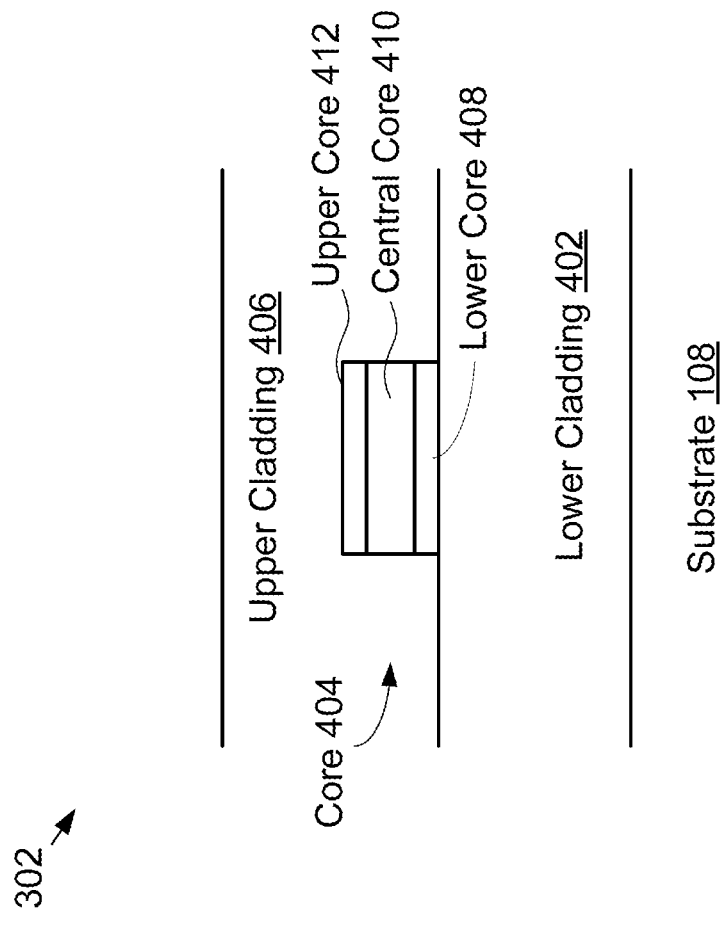
FIG. 4 depicts a schematic drawing of a cross-sectional view of an integrated-optics-based surface waveguide in accordance with the illustrative embodiment.

FIG. 4 depicts a schematic drawing of a cross-sectional view of an integrated-optics-based surface waveguide in accordance with the illustrative embodiment. Input waveguide 302 is a silicon-nitride-based, double-stripe waveguide that includes lower cladding 402, core 404, and upper cladding 406, which are disposed on substrate 108. Input waveguide 302 is representative of each of the waveguides included in PLC 106.

Each of lower and upper claddings 402 and 406 are conventional cladding layers suitable for substantially confining optical energy within core 404. In the depicted example, each of claddings 402 and 406 comprises silicon dioxide.

Core 404 is a multi-layer core comprising a lower core layer 408, central core layer 410, and upper core layer 412. Each of lower core layer 408 and upper core layer 412 comprises stoichiometric silicon nitride (i.e., $Si_3N_4$) and central core layer 410 comprises stoichiometric silicon dioxide. The width of core 404 and the thicknesses of the lower, central, and upper layers of the waveguide structure are selected to facilitate low-loss, single-mode propagation of light having wavelengths within the telecommunications C-band. In the depicted example, core 404 has a width of 1.2 microns, lower core layer 408 and upper core layer 412 each have a thickness of approximately 170 nm, and central core layer 410 has a thickness of approximately 500 nm; however, any practical value can be used for any of these dimensions. In some embodiments, lower core layer 408 and upper core layer 412 have different thicknesses, thereby forming an asymmetric double-stripe waveguide structure. Examples of waveguides in accordance with the present disclosure are disclosed by Roeloffzen, et al., in "Low-loss $Si_3N_4$ TriPleX™ optical waveguides: Technology and applications overview," *IEEE J. Sel. Top. Quantum Electron* 24 (4), 1-21 (2018), and U.S. Pat. No. 7,146,087, each of which is incorporated herein by reference.

The use of silicon-nitride-based surface waveguides affords embodiments in accordance with the present disclosure particular advantages, such as enabling small ring diameters and/or high-waveguide density; however, it should be noted that any suitable surface waveguide comprising any suitable material can be used in PLC 106 without departing from the scope of the present disclosure. Furthermore, silicon nitride-based waveguides can be designed for operation anywhere within a wide wavelength range that extends from approximately 400 nm to approximately 2400 nm. As a result, such waveguides can be used with any of a wide range of gain elements—virtually any gain element that is operable within this wavelength range.

Returning now to FIG. 3, in some embodiments, input port 110 includes a spotsize converter configured to substantially match the mode-field size and/or shape to the optical mode of gain element 104. Spotsize converters suitable for use in accordance with the present disclosure are disclosed in U.S. Pat. Nos. 8,718,432, and 9,268,089, each of which is incorporated herein by reference. In some embodiments, input port 110 is a vertical-grating coupler.

Input waveguide 302 optically couples input port 110 and splitter 304. In the depicted example, splitter 304 is a conventional tunable coupler; however, in some embodiments splitter 304 includes a different suitable splitting element (e.g., a y-splitter, a directional coupler, etc.). As a result, a light signal received at the input port is substantially equally split into outer waveguides 308A and 308B. It should be noted that particular advantages are afforded embodiments in which splitter 304 employs a tunable coupler because such an arrangement enables precise control over the optical power within the laser cavity, which further enables control over the photon-pair generation rate.

Input waveguide 302 includes modulator 306, which is a phase modulator configured to modulate the phase of the light received at splitter 304. The inclusion of modulator 306 enables a desired time slot in which the photon pair can be generated to be established. In some embodiments, modulator 306 is included in gain element 104, rather than in PLC 106.

In the depicted example, modulator 306 is a conventional thermo-optic phase modulator comprising a heater disposed on input waveguide 302. In some embodiments, modulator 306 is a stress-optic phase modulator comprising a piezoelectric material that is operatively coupled with input waveguide 302. Phase modulators suitable for use in accordance with the present disclosure are described in U.S. Pat. Nos. 9,221,074 and 9,764,352, each of which is incorporated herein by reference. In some embodiments, modulator 306 is other than a phase modulator, such as an amplitude modulator, an electroabsorption modulator, and the like.

Resonant element 112 includes ring-resonators RR1 through RR5, outer waveguides 308A and 308B, bus waveguides 310A through 310D, and output ports 114A and 114B. Outer waveguides 308A and 308B, ring-resonators RR1 through RR5, and bus waveguides 310A through 310D are arranged to collectively define a Vernier-type ring-resonator-based waveguide mirror that functions as mirror M2 of laser cavity LC1.

Bus waveguides 310A through 310D (referred to, collectively, as bus waveguides 310), and ring-resonators RR1 through RR5 are optically coupled in series between outer waveguides 308A and 308B (referred to, collectively, as outer waveguides 308), where each pair of adjacent ring resonators is evanescently coupled via a different one of bus waveguides 310.

Each of ring-resonators RR1 through RR5 is a closed-loop waveguide having a radius selected to give rise to a resonance condition suitable for the function of mirror M2. Furthermore, typically, each of ring-resonators RR1 through RR5 is tunable via a thermal- or stress-optic tuning mechanism.

Generally, ring-resonators RR1 through RR5 have diameters that are a range of between about 20 to 100 microns, which endows each ring resonator with a free spectral range that is in a range of between about 4 nanometers (at 100 microns diameter) to about 10 nanometers (at 20 microns diameter). It should be noted, however, that any suitable radius can be used for any of the ring resonators. In some embodiments, at least one of ring-resonators RR1 through RR5 has a closed-loop shape other than a ring, such as an oval, an irregular shape, a race-track-type closed-loop, and the like. As will be apparent to one skilled in the art, a race-track-type closed-loop has a rounded shape that includes straight sections along at least one direction (i.e., approximates a rectangle having "rounded" corners).

Ring-resonators RR1 through RR5 are optically coupled via bus waveguides 310A through 310D to exploit the Vernier principle and increase the total FSR of mirror M2. In some embodiments, ring-resonators RR1 through RR5 have different diameters. In some embodiments, ring-resonators RR1 through RR5 have the same diameter, thereby realizing a higher-order filter with increased signal-to-noise ratio.

At operation 202, at least one correlated photon pair is generated in a waveguide resonator of resonant element 112.

In the depicted example, ring resonator RR3 is configured as a photon-pair-generating ring and its size is selected to foster four-wave mixing within it to generate photon pairs.

It should be noted that the inclusion of plurality of waveguide resonators that includes a closed-loop element configured to enable four-wave mixing in PLC 106 affords embodiments in accordance with the present disclosure significant advantages over photon-pair sources known in the prior art. In particular, since ring resonator RR3 is included within the laser cavity of source 100, the four-wave mixing gives rise to the generation of photon pairs within the laser cavity itself. As a result, it is not necessary to tune ring resonators RR1 through RR5 to generate photon pairs, nor is it necessary to lock/stabilize source 100 with an external laser.

In addition, by the proper choice of gain element 104 and appropriately sizing ring resonator R3, the output of source 100 can be tailored to fit within any desired wavelength range, such as the standard wavelengths used in optical telecommunications (i.e., the ITU grid).

At operation 203, the generated correlated photon pairs are conveyed to output ports 114A and 114B.

It should be noted that systems in accordance with the present disclosure can employ a quantum state of light generated by four-wave mixing other than a correlated photon pair, such as a squeezed state of light, and the like.

In the depicted example, bus waveguides 310B through 310C extend to an edge of substrate 108 to define output ports 114A and 114B. In some embodiments, output ports 114A and 114B include spotsize converters to mitigate coupling loss to external elements, such as optical fibers. In some embodiments, at least one of output ports 114A and 114B includes a vertical-grating coupler.

It is another aspect of the present disclosure that light circulates in both directions within ring RR3, which enables photon pairs to be advantageously provided at each of two output ports, thereby enabling generation of twice as many photon pairs than can be generated by prior-art photon-pair sources. Thus, embodiments in accordance with the present disclosure are afforded significant additional advantages over photon-pair sources of the prior art.

Figure 5:
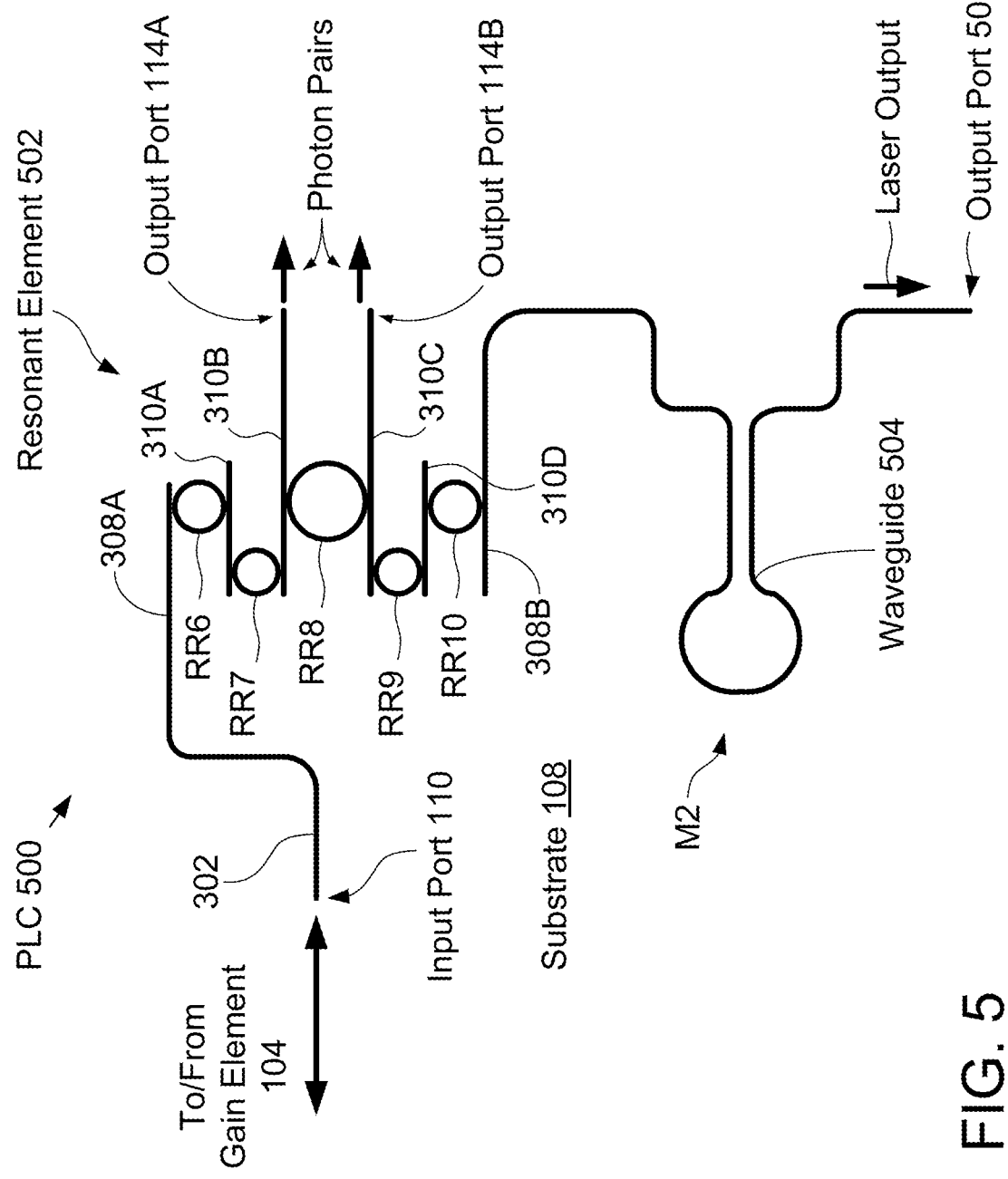
FIG. 5 depicts a schematic drawing of a detailed view of an alternative PLC in accordance with the present disclosure.

FIG. 5 depicts a schematic drawing of a detailed view of an alternative PLC in accordance with the present disclosure. PLC 500 includes input waveguide 302, resonant element 502, waveguide 504, and output ports 114A and 114B.

PLC 500 is analogous to PLC 106; however, in PLC 500, resonant element 502 functions as an in-line wavelength filter bank rather than a waveguide mirror and an additional Sagnac loop mirror is included as mirror M2.

Resonant element 502 is analogous to resonant element 112; however, resonant element is optically coupled with gain element 104 via only outer waveguide 308A, while outer waveguide 308B is extended to become waveguide 504.

Like resonant element 112, resonant element 502 includes five waveguide resonators that are closed-loop waveguides shaped as circular rings, thereby defining ring resonators RR6 through RR10. The shapes and sizes of ring resonators RR6 through RR10 are selected to realize the desired wavelength filtering functionality of resonant element 502. It should be noted that any practical shape and/or size can be used for any of the waveguide resonators of resonant element 112.

Like ring resonator RR3 described above, ring resonator RR8 is configured as a photon-pair-generating ring and its size is selected to foster four-wave mixing within it to generate photon pairs. As a result, correlated waveguide pairs are provided to output ports 114A and 114B, as discussed above and with respect to FIG. 3.

Waveguide 504 is configured to define a Sagnac loop mirror that functions as mirror M2. Waveguide 504 also includes output port 506, at which the output of laser 102 is provided.

In some embodiments, the laser output is used as a reference signal, local oscillator (for example, in quantum computing applications, etc.), and the like.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A source for providing correlated photon pairs, the source comprising an external cavity laser having a gain cavity, the external cavity laser including:
    a gain element that is disposed on a substrate, the gain element comprising a first mirror; and
    a planar lightwave circuit (PLC) disposed on the substrate, the PLC including:
        (i) a second mirror, wherein the second mirror includes at least one integrated-optics-based surface waveguide;
        (ii) first and second output ports for providing the photon pairs; and
        (iii) a plurality of waveguide resonators that includes a first waveguide resonator having a size that fosters four-wave mixing, the plurality of waveguide resonators being coupled in a Vernier configuration that is located within the laser cavity;
    wherein the second mirror resides within the laser cavity;
    wherein the laser cavity is isolator-free; and
    wherein the first and second output ports being optically connected with the first waveguide resonator, and wherein each of the first and second output ports is operative for providing one or more photon pairs.

2. The source of claim 1 further comprising:
    a first bus waveguide that is optically connected with the first waveguide resonator such that light can evanescently couple between them, the first bus waveguide including the first output port; and
    a second bus waveguide that is optically connected with the first waveguide resonator such that light can evanescently couple between them, the second bus waveguide including the second output port.

3. The source of claim 1 wherein at least one waveguide resonator of the plurality of waveguide resonators includes a closed-loop waveguide element selected from the group consisting of a ring, an oval, and a racetrack.

4. The source of claim 1 wherein the second mirror includes a surface waveguide configured as a Sagnac loop mirror.

5. The source of claim 1 wherein the second mirror includes the plurality of waveguide resonators.

6. The source of claim 5 wherein the waveguide resonators of the plurality of waveguide resonators are optically coupled in series between first and second outer bus waveguides, and wherein the PLC further includes a tunable coupler having a first output optically coupled with the first outer bus waveguide and a second output optically coupled with the second outer bus waveguide.

7. The source of claim 6 wherein the plurality of waveguide resonators is between the gain element and the second mirror, and wherein each waveguide resonator of the plurality of waveguide resonators is configured as a wavelength filter.

8. The source of claim 1 wherein the at least one integrated-optics-based surface waveguide has a multi-layer core that includes a silicon dioxide layer that is located between a pair of silicon nitride layers.

9. A method for generating correlated photon pairs, the method including:
    exciting optical energy in a laser cavity of an external cavity laser comprising a gain element and a planar lightwave circuit (PLC), the gain element and the PLC being disposed on a substrate, wherein the laser cavity is isolator-free and includes a first mirror and a second mirror that is within the laser cavity, and wherein the gain element comprises the first mirror and the PLC comprises:
        (i) the second mirror, where the second mirror includes at least one integrated-optics-based surface waveguide;
        (ii) a plurality of waveguide resonators that includes a first waveguide resonator having a size that fosters four-wave mixing, wherein the waveguide resonators of the plurality thereof are optically coupled in a Vernier configuration that is located within the laser cavity; and
        (iii) first and second output ports, each of the first and second optical ports being (1) directly optically coupled with the first waveguide resonator and (2) operative for providing one or more photon pairs;
    generating at least one correlated photon pair in the first waveguide resonator; and
    conveying the at least one correlated photon pair to at least one of the first and second output ports.

10. The method of claim 9 further comprising providing the PLC such that it includes:
    (iv) a first bus waveguide that is optically connected with the first waveguide resonator such that light can evanescently couple between them, the first bus waveguide including the first output port; and
    (v) a second bus waveguide that is optically connected with the first waveguide resonator such that light can evanescently couple between them, the second bus waveguide including the second output port.

11. The method of claim 9 wherein the PLC is provided such that the second mirror includes the plurality of waveguide resonators.

12. The method of claim 11 further comprising:
    providing the PLC such that the waveguide resonators of the plurality of waveguide resonators are optically coupled in series between first and second outer bus waveguides and the PLC further includes (v) a tunable coupler having a first output optically coupled with the first outer bus waveguide and a second output optically coupled with the second outer bus waveguide; and
    controlling the tunable coupler to control a rate at which photon pairs are generated.

13. The method of claim 9 wherein the PLC is provided such that the second mirror includes a surface waveguide configured as a Sagnac loop mirror.

14. The method of claim 13 wherein the PLC is provided such that the plurality of waveguide resonators is between the gain element and the second mirror and each waveguide resonator of the plurality of waveguide resonators is configured as a wavelength filter.

15. The method of claim 9 wherein the PLC is provided such that the at least one integrated-optics-based surface waveguide has a multi-layer core that includes a silicon dioxide layer that is located between a pair of silicon nitride layers.

* * * * *